United States Patent
Cheng et al.

(10) Patent No.: US 10,971,402 B2
(45) Date of Patent: Apr. 6, 2021

(54) SEMICONDUCTOR DEVICE INCLUDING INTERFACE LAYER AND METHOD OF FABRICATING THEREOF

(71) Applicant: Taiwan Semiconductor Manufacturing Co., Ltd., Hsinchu (TW)

(72) Inventors: Chung-Liang Cheng, Changhua County (TW); I-Ming Chang, ShinChu (TW); Hsiang-Pi Chang, New Taipei (TW); Yu-Wei Lu, Taipei (TW); Ziwei Fang, Hsinchu (TW); Huang-Lin Chao, Hillsboro, OR (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/443,016

(22) Filed: Jun. 17, 2019

(65) Prior Publication Data

US 2020/0395250 A1   Dec. 17, 2020

(51) Int. Cl.
*H01L 21/8234*     (2006.01)
*H01L 27/088*      (2006.01)
*H01L 29/10*       (2006.01)
*H01L 21/02*       (2006.01)

(52) U.S. Cl.
CPC ............... *H01L 21/823431* (2013.01); *H01L 21/02236* (2013.01); *H01L 21/02381* (2013.01); *H01L 21/02532* (2013.01); *H01L 21/823462* (2013.01); *H01L 27/0886* (2013.01); *H01L 29/1033* (2013.01)

(58) Field of Classification Search
CPC ......... H01L 21/02236; H01L 21/02381; H01L 21/02532; H01L 21/70; H01L 21/702; H01L 21/71; H01L 21/78; H01L 21/82; H01L 21/822; H01L 21/8232; H01L 21/823431; H01L 21/823462; H01L 21/823487; H01L 21/8238; H01L 21/823821; H01L 21/823857; H01L 27/085; H01L 27/088; H01L 27/0886; H01L 27/10; H01L 27/105; H01L 29/1025; H01L 29/1029; H01L 29/1033; H01L 29/1079; H01L 29/42384
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |

(Continued)

*Primary Examiner* — Cheung Lee
(74) *Attorney, Agent, or Firm* — Haynes and Boone, LLP

(57) ABSTRACT

A method includes providing a channel region and growing an oxide layer on the channel region. Growing the oxide layer includes introducing a first source gas providing oxygen and introducing a second source gas providing hydrogen. The second source gas being different than the first source gas. The growing the oxide layer is grown by bonding the oxygen to a semiconductor element of the channel region to form the oxide layer and bonding the hydrogen to the semiconductor element of the channel region to form a semiconductor hydride byproduct. A gate dielectric layer and electrode can be formed over the oxide layer.

20 Claims, 10 Drawing Sheets

(56) References Cited

U.S. PATENT DOCUMENTS

| | | | |
|---|---|---|---|
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2017/0133486 A1* | 5/2017 | Zhou | H01L 21/823842 |

\* cited by examiner

SEMICONDUCTOR DEVICE INCLUDING INTERFACE LAYER AND METHOD OF FABRICATING THEREOF

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes, different type FinFETs are configured with different fin materials to further enhance performance. The different materials can be used to provide a suitable channel region in the fin of the FinFET based on desired device performance. When forming a gate over this channel region of the fin, it has been observed that an interface layer formed over the fin element and an overlying layer may be used. Providing this interface layer suitable for differently configured fins can raise challenges. In particular, as feature sizes shrink, fabricating gate stacks with quality layers of appropriate thickness can raise challenges.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
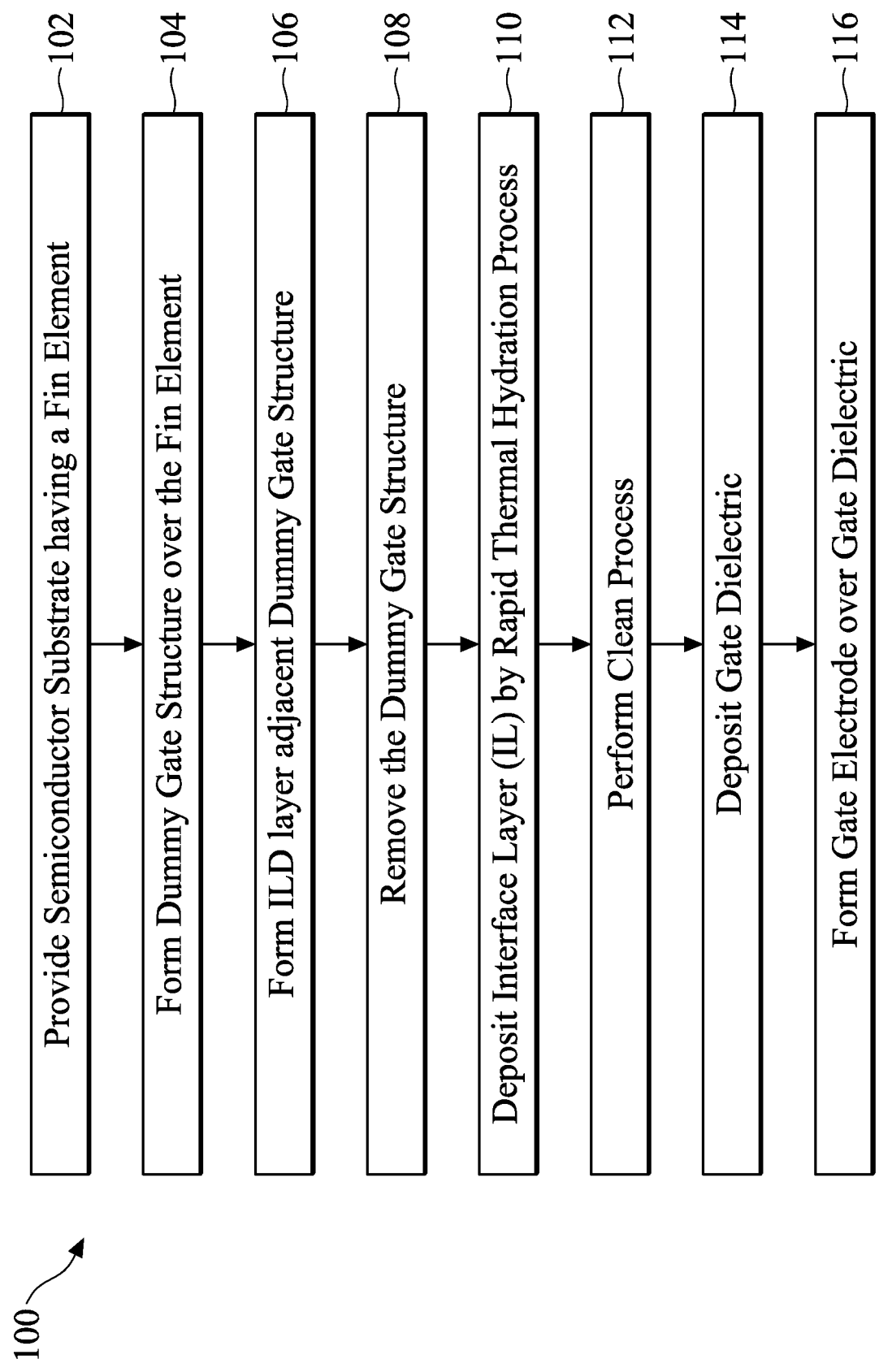
FIG. 1 is a flowchart illustrating an embodiment of a method of fabricating a semiconductor device according to various aspects of the present disclosure.

The present disclosure relates generally to devices such as fin-like field effect transistor (FinFET) devices, and more particularly, to formation of layers such as interface layers of a gate stack over the channel region of the devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

For advanced IC technology nodes, FinFETs (also referred to as non-planar transistors) have become a popular and promising candidate for high performance and low leakage applications. To enhance channel mobility, different type FinFETs are often configured with different fin materials (in particular, different channel materials). Different fin materials respond differently to subsequent processing, creating challenges during FinFET fabrication. On these channel materials, gate stacks are formed. The gate stacks include interface layers formed on the channel region and above which the gate dielectric and gate electrode are formed.

The present disclosure addresses challenges of forming gate stacks and interface layers in particular by implementing methods and structures for devices including an interface layer. In some implementations, thermal hydridation processes, described below, are used to form interface layers directly on the channel regions preparing the channel regions for formation of additional layers of the gate stack (e.g., gate dielectric layers).

FIG. 1 is illustrative of an embodiment of a method 100 of fabricating a device including an interface layer according to one or more aspects of the present disclosure. The method 100 may be used to fabricate a FinFET device, or other type of FET device. FIGS. 2-8 provide one example FinFET device. Specifically, FIGS. 2-8 are fragmentary cross-sectional views of a FinFET device 200, in portion or entirety, at various fabrication stages corresponding to FIG. 1 and according to various aspects of the present disclosure.

Figure 2:
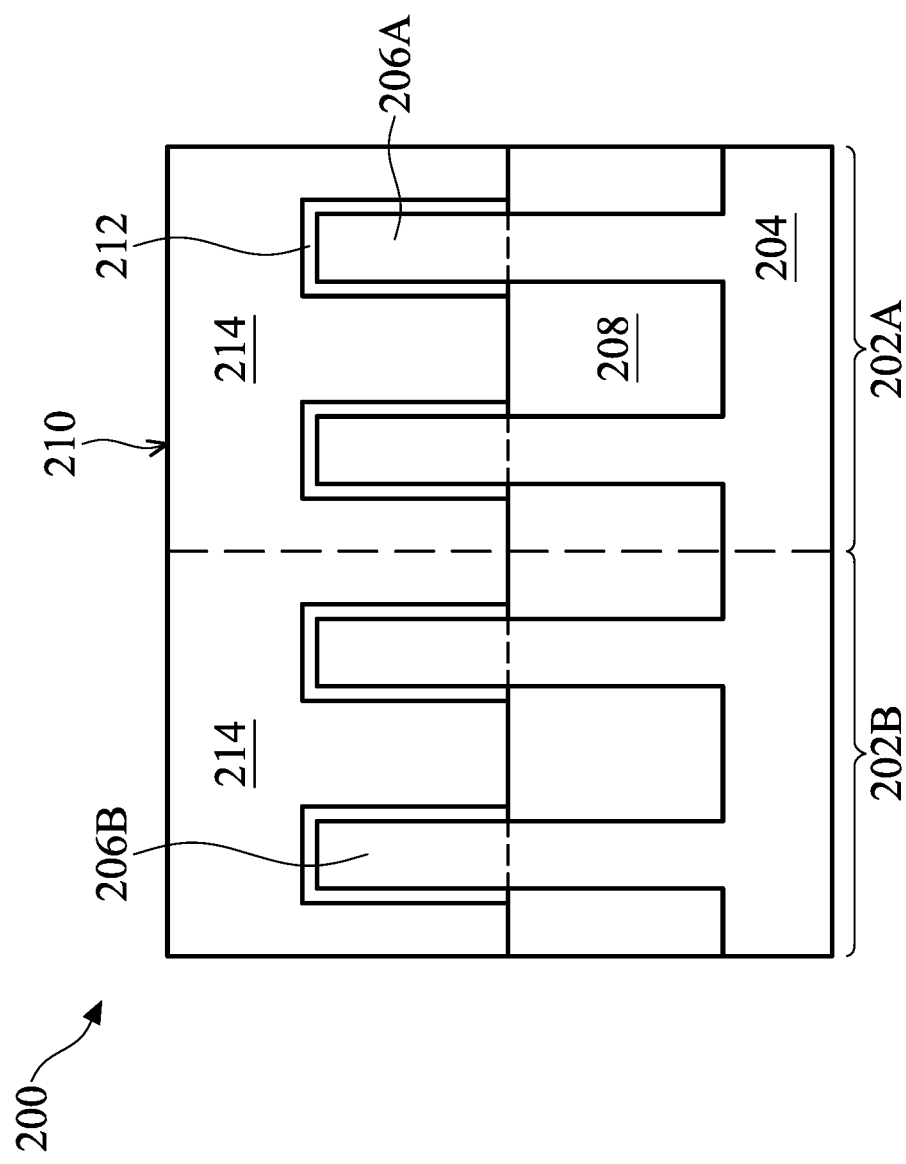
FIGS. 2-8 are fragmentary cross-sectional views of a FinFET device, in portion or entirety, at various fabrication stages according to various aspects of the present disclosure and exemplifying steps of the method of FIG. 1.
Figure 3:
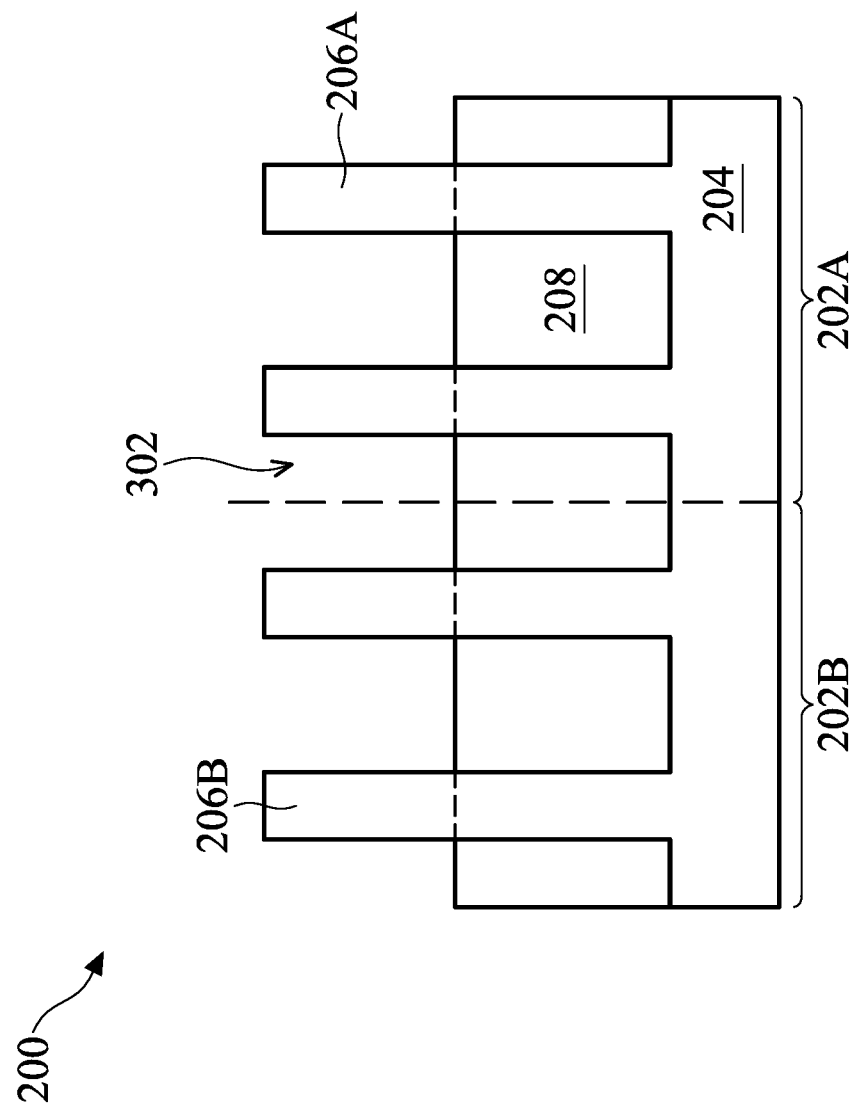
Figure 4:
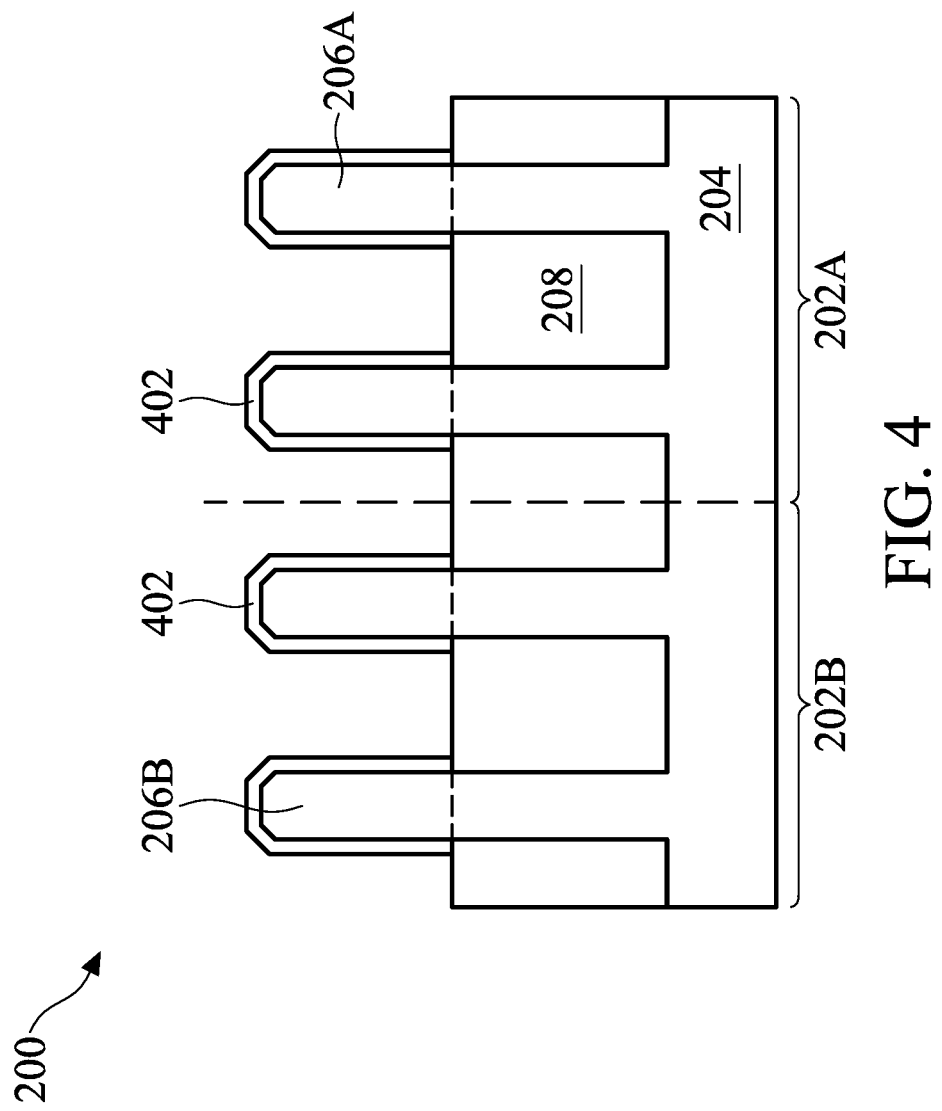

In the depicted embodiment such as illustrated in FIG. 2, a FinFET device 200 includes an NMOS region 202A configured to include a n-type device such as n-type FinFETs and a PMOS region 202B configured to include p-type devices such as p-type FinFETs, such that FinFET device 200 includes a complementary FinFETs. In some implementations, NMOS region 202A and PMOS region 202B are a portions of a device region, such as a core region (often referred to as a logic region), a memory region (such as a static random access memory (SRAM) region), an analog region, a peripheral region (often referred to as an I/O region), a dummy region, other suitable region, or combinations thereof. The device region can include various passive and active microelectronic devices, such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some implementations, FinFET device 200 may be a portion of an IC chip, a system on chip (SoC), or portion thereof. FIGS. 2-8, like the remaining figures presented herein, have been simplified for the sake of clarity to better understand the inventive concepts of the present disclosure. Additional features can be added in FinFET device 200, and some of the features described below can be replaced, modified, or eliminated in other embodiments of FinFET device 200.

The method 100 begins at block 102 where a semiconductor substrate is provided. In an embodiment, the semiconductor substrate includes fin elements rising from the semiconductor substrate. As an aside, it is generally noted that the present application uses a FinFET as an exemplary semiconductor device. However, in other embodiments, a planar device may be fabricated including providing an interface layer such as discussed herein for a planar device, for example, growing the interface layer on a planar channel region. In other embodiments, a Gate-All-Around (GAA) device may be fabricated including the interface layer discussed herein in a gate stack for GAA multi-gate device.

Referring to the example of FIG. 2, FinFET device 200 includes a substrate (wafer) 204. In the depicted embodiment, substrate 204 includes silicon. Alternatively or additionally, substrate 204 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as silicon germanium (SiGe), SiPC, GaAsP, AlInAs, AlGaAs, GaInAs, GaInP, and/or GaInAsP; or combinations thereof. Alternatively, substrate 204 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, substrate 204 includes one or more group III-V materials, one or more group II-IV materials, or combinations thereof.

As illustrated in FIG. 2, fin elements 206 extend from the substrate 204. As in FinFET devices, the fin elements 206 include a raised portion over which a gate stack will be formed such that a channel is formed within each of the fin elements 206. Substrate 204 and/or the fin elements 206 discussed below may include various doped regions configured according to design requirements of the FinFET device 200. In an embodiment, the fin elements 206B of the PMOS region 202B of the substrate have a different composition and/or doping profile than the fin elements 206A of the NMOS region 202A. In an embodiment, the fin elements 206B are silicon germanium. In an embodiment, the fin elements 206A are silicon.

In some embodiments, the semiconductor material in the fin elements 206B or portions thereof are different from that of the substrate 204 for various considerations, such as strain effect for high mobility or using a semiconductor material of high mobility. As stated above, in some embodiments, the fin elements 206B includes silicon germanium. Other examples include germanium, silicon germanium tin (SiGeSn), germanium tin (GeSn), or a compound semiconductor material from III-V groups. In exemplary embodiments, the compound semiconductor material from III-V groups includes gallium arsenide, gallium arsenide phosphide, gallium nitride, gallium phosphide, indium arsenide, indium gallium arsenide, indium gallium nitride, indium gallium phosphide, indium nitride, indium phosphide, aluminum arsenide, aluminum gallium arsenide, aluminum gallium indium phosphide, aluminum gallium nitride, aluminum gallium phosphide, aluminum indium arsenide, aluminum nitride, aluminum phosphide, or a combination thereof. In further examples, the fin elements 206B may include two or more semiconductor material films. It is noted that in some embodiments, the fin elements 206B include an upper portion that forms the channel region (e.g., above an isolation region 208) which may include a first semiconductor material such as silicon germanium, while a bottom portion of the fin (e.g., within the isolation region) remains another semiconductor material for example that of the substrate (e.g., silicon).

In some embodiments, the semiconductor material in the fin elements 206A are the same as the substrate 204 and may be different from that of the fin elements 206B for various considerations of device performance. In various examples, the fin elements 206A includes silicon. However, embodiments are not limited thereto and the composition of the fin elements 206A may include other compositions including those discussed above with reference to fin elements 206B.

Isolation features 208 are formed between fin elements 206 as illustrated in FIG. 2. The isolation features 208 include dielectric material such as silicon oxide, silicon nitride, air gaps, and/or other suitable dielectric materials. The isolation features 208 may include a plurality of layers for example, including a liner layers. In some implementations, layers of the isolation features 208 are formed by CVD such as, high density plasma CVD (HDPCVD), metal organic CVD (MOCVD), remote plasma CVD (RPCVD), PECVD, LPCVD, atmospheric pressure CVD (APCVD), sub-atmospheric vapor deposition (SAVCD); atomic layer deposition (ALD), oxidation processes, other suitable methods, or combinations thereof. In some embodiments, the isolation features 208 are referred to as shallow trench isolation (STI) features. The isolation features 208 are recessed such that channel regions of the fin elements 206 extend above the isolation features 208.

Referring again to FIG. 1, the method 100 continues to block 104 where one or more dummy gate structures are disposed over a channel region or regions of the substrate (e.g., fin element(s)). The dummy gate structures may be placeholders defining the position of the final gate. Various processes may be performed on the substrate while the dummy gate structures are disposed over, defining and protecting, the channel regions. Referring to the example of FIG. 2, dummy gate structures 210 are formed over the fin elements 206. The dummy gate structures 210 may include a plurality of layer such as a dummy oxide layer 212 and a dummy electrode layer 214. The dummy oxide layer 212 may include silicon oxide. The dummy electrode layer 214 may include polysilicon. However, other compositions for the dummy gate structures 210 are also possible. The materials of the dummy gate structures 210 may be substantially similar in the NMOS region 202A and the PMOS region 202B of the substrate 204. It is noted that the dashed line in the device 200 illustrates that there may be additional features interposing region 202B and 202A of the substrate 204. The number of fin elements 206 and dummy gate structures 210 being exemplary only.

The dummy gate structures 210 may be formed over the fin elements 206 by blanket deposition of one or more materials and subsequently patterning these materials to form the dummy gate structures 210. The patterning of the dummy gate structures 210 includes a lithography process and etching. In an exemplary embodiment, a lithography process forms a patterned resist layer. In one example, the formation of the patterned resist layer includes resist coating, soft baking, exposing, post-exposure baking (PEB), developing, and hard baking. The dummy gate stack material layers are thereafter patterned by etching using the patterned resist layer as an etching mask. The etching process may include one or more etching steps. For example, multiple etching steps with different etchants may be applied to etch respective gate stack material layers. In other embodiments, the patterning of the gate stack material layers may alternatively use a hard mask as an etching mask. The hard mask may include silicon nitride, silicon oxynitride, silicon oxide, other suitable material, or a combination thereof. The patterned resist layer may be removed thereafter using a suitable process, such as wet stripping or plasma ashing.

After patterning the gate stack forming the dummy gate structure 210, spacer elements may be formed on the sidewalls of the dummy gate structures 210. Gate spacer elements are formed by any suitable process and include a dielectric material. The spacer elements maybe formed by depositing dielectric material and etching (e.g., anisotropic etch (such as dry etch)) the material to form spacer elements. The dielectric material can include silicon, oxygen, carbon, nitrogen, other suitable material, or combinations thereof (for example, silicon oxide, silicon nitride, silicon oxynitride, or silicon carbide). In some embodiments, gate spacer elements include a multi-layer structure, such as a first dielectric layer that includes silicon nitride and a second dielectric layer that includes silicon oxide. In some embodiments, gate spacer elements include more than one set of spacers, such as seal spacers, offset spacers, sacrificial spacers, dummy spacers, and/or main spacers, formed adjacent to the gate stacks.

After formation of the dummy gate structure, implantation, diffusion, and/or annealing processes may be performed to form LDD features and/or HDD features (both of which are not shown) in source/drain regions of fins before and/or after forming gate spacer elements.

Referring again to FIG. 1, the method 100 continues to block 106 where a dielectric layer, such as an interlayer dielectric (ILD) layer, is formed on the substrate. The ILD layer is formed adjacent the dummy gate structure (including gate spacer elements). The ILD layer may be deposited after formation of source/drain features associated with the device 200. The ILD layer includes a dielectric material or materials including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. In some implementations, the formed ILD layer has a multilayer structure having multiple dielectric materials. In some embodiments, ILD layer is formed by a deposition process (such as CVD, PVD, ALD, FCVD, HDPCVD, MOCVD, RPCVD, PECVD, LPCVD, ALCVD, APCVD, plating, other suitable methods, or combinations thereof) after forming the dummy gate structures. Block 106 may further include forming additional dielectric layers including, for example, a contact etch stop layer (CESL). In an embodiment, a CESL layer is formed prior to the ILD layer. Subsequent to the deposition of the materials forming the ILD layer and/or other dielectric layers formed, a chemical mechanical planarization (CMP) process and/or other planarization process is performed. The planarization process removes the dielectric material such that a top portion of the dummy gate is reached (exposed).

The method 100 then continues to block 108 where the dummy gate structure(s) or portions thereof are removed. The removal may be performed by applying selective etchants that remove layers of the dummy gate structure such as the dummy gate dielectric and dummy gate electrode in one or more etching steps. Referring to the example of FIG. 3, the dummy gate structure 210 has been removed forming trench openings 302. The removal of the dummy gate structure 210 includes removing (e.g., etching) the dummy oxide layer 212 and the dummy gate electrode 214. The removal of the dummy gate structure(s) leaves trench openings 302 exposing channel regions of the fin elements 206. In an embodiment, a surface of the fin elements 206 is exposed where the surface is substantially semiconductor material of the fin elements 206A and 206B including the materials discussed above.

After the removal of the dummy gate structure(s), the method continues to block 110 where an interface layer (IL) is formed on the region of the fin elements exposed by the removal of the dummy gate structures. The interface layer provides a dielectric layer over the fin elements (e.g., channel region).

The interface layer of block 110 may be formed using a rapid thermal hydridation (RTH) process, which is discussed in detail below. Referring to the example of FIG. 4, an interface layer 402 is formed over the fin elements 206. In some embodiments, a RTH process forms the interface layer 402. In an embodiment, a RTH process forms the IL 402 simultaneously over the fins 206 of the NMOS region 202A and the PMOS region 202B. While the formation may occur simultaneously, because of differences in composition of the fins 206A and 206B, the IL 402 may be comprised of different materials in NMOS region 202A than the IL 402 in PMOS region 202B. In an embodiment, IL 402 in PMOS region 202B is SiGeOx. In an embodiment, IL 402 in NMOS region 202A is SiOx. Similarly, while formed concurrently, because of the difference in oxidation rates of the semiconductor materials of fins 206B from 206A, the thicknesses of the IL 402 may be different between PMOS region 202B and NMOS region 202A. In an embodiment, IL 402 is thicker in PMOS region 202B than in NMOS region 202A (e.g., silicon germanium oxidizing faster than silicon).

As discussed above, in some embodiments, the fin 206B includes a semiconductor composition selected for performance of the devices to be formed in the PMOS region 202B of the device 200. For example, the channel region of the fin 206B (e.g., upper portion of the fin 206B above the isolation features 208) may be silicon germanium. The silicon germanium channel material may provide advantages to the devices, the PMOS devices of region 202B, due to its high mobility. However, use of this channel material also raises challenges. For example, chemical growth of a dielectric layer over a silicon germanium comprising fin, such as chemical growth of a dielectric by exposure to a water vapor atmosphere, can cause the SiGe channel region to experience an increase in the relative concentration of germanium (Ge), referred to as a Ge pile-up condition. The Ge pile-up condition may provide for excess germanium at a surface of the channel region. A similarly resulting Ge pile-up condition may be experienced using a chemical growth of a dielectric layer over SiGe channel region using typical dry oxidation processes as well (e.g., providing molecular oxygen for the oxygen source). The Ge pile-up can decrease device performance by leading to a degradation in mobility. Similarly, these chemical oxidation processes can lead to the channel region surface (e.g., silicon germanium, silicon). The surface roughness may also decrease the device performance by causing degradation in mobility. Aspects of the present disclosure in some embodiments provide for an improvement in surface roughness and/or Ge pile up, which is discussed in further detail below with reference to FIG. 8. In discussions in the present disclosure, comparison with a chemically grown oxide (CIL) such as grown by a wet clean process exposing a semiconductor feature to an ozone (O3)+Standard Clean 1 (SC1)+Standard Clean 2 (SC2) process sequence. SC1 includes deionized water, ammonia, hydrogen peroxide. SC2 includes deionized water, hydrochloric acid (HCl) and hydrogen peroxide (H2O2).

Returning to the presently discussed method, the method 100 includes at block 110 formation of an interface layer (IL) 402. The IL 402 is formed using a process referred to herein as rapid thermal hydridation (RTH). In some embodiments, the IL 402 formed by the RTH processes discussed herein may serve to reduce the Ge pile-up and improve surface roughness. While not being bound to any one theory, it is contemplated that the hydrogen provided in the RTH process may contribute to —H to bond with the Ge, which is then purged from the apparatus as a byproduct. Thus, reducing the pile-up of germanium in the SiGe channel region (e.g., fin). Because of this, use of the RTH process to form the IL 402 can result in a mobility improvement for the device 200 in comparison with that of a chemically grown dielectric layer over the fins 206.

In an embodiment, the rapid thermal hydridation (RTH) process includes introducing hydrogen (or a hydride, which is an anion of hydrogen) that will bond to the available semiconductor element of the fin 206. In an embodiment, the fin 206 is silicon germanium, and the RTH process introduces hydrogen to bond with the germanium (Ge) of the fin. In an embodiment, the hydrogen bonds to the excess germanium thus, alleviating the Ge pile-up condition. The bonding of the Ge and hydrogen form a hydride including Ge and H, such as $GeH_4$. The germanium hydride is then outgassed from the chamber as a byproduct of the process. While the example of germanium and Ge pile-up is discussed herein, other semiconductor materials used for the channel region may also provide available elements for bonding with the available hydrogen including, but not limited to silicon, gallium, indium, arsenic and/or other suitable elements.

In addition to introducing the hydrogen, the RTH process also includes introducing an oxygen source. The oxygen source is used to provide oxygen for formation of the IL 402, which has an oxide composition. For example, in an embodiment, the fin 206 is silicon germanium, the oxygen provided in the RTH process bonds to the SiGe forming SiGeOx, which forms the IL 402. As another example, in an embodiment, the fin 206 is silicon, the oxygen provided in the RTH process bonds to the Si forming SiOx, which forms the IL 402. Oxides of various other compositions are possible including those materials discussed above with respect to fins 206. In an embodiment, IL 402 in PMOS region 202B SiGeOx, while the IL 402 in NMOS region 202A is SiOx.

Additional components may also be provided in the RTH process such an inert gases or carrier gases, for example, nitrogen. In another embodiment, the carrier gas may be argon (Ar) gas. Thus, in an embodiment, the RTH process consists of a carrier gas ($N_2$), an oxygen source of $O_2$, and a hydrogen source separate from the oxygen source. In a further embodiment, the oxygen source of $O_2$ is the only source of oxygen (e.g., there is no water vapor provided to the chamber purposefully).

In an embodiment, the RTH process forms IL 402 by implementing one or more of the following exemplary process parameters. In an embodiment, the RTH process is conducted at a temperature of between approximately 650 Celsius and approximately 850 Celsius. The temperature is selected to promote the reaction of hydrogen and/or oxygen with the materials of the fin 206, while not damaging the fin 206 or surrounding elements. In an embodiment, the pressure of the chamber providing the RTH process is between approximately 5 torr and approximately 20 torr. Like the temperature range, the pressure is selected to promote the reaction, while reducing the risk of damage to features of the device 200.

Continuing with the discussion of the RTH process parameters, as discussed above, the RTH process includes providing hydrogen, oxygen, and a carrier gas (e.g., nitrogen). In an embodiment, the hydrogen source ($H_2$) flow is provided to the substrate 204 between approximately 0.8 slm and approximately 4.6 slm. In an embodiment, the oxygen source ($O_2$) flow is provided to the substrate 204 is between approximately 15 sccm and approximately 150 sccm. In an embodiment, the carrier gas ($N_2$) flow is provided to the substrate 204 between approximately 7.2 slm and approximately 10.4 slm. In some embodiments, the ratio of hydrogen (e.g., $H_2$) to oxygen (e.g., $O_2$) provided to the substrate 204 in the RTH process is between approximately 5:1 to approximately 320:1 by volume. The oxygen, hydrogen and/or carrier gas may be provided concurrently to a chamber holding the substrate 204. In an embodiment, the only provision of oxygen to the chamber is by the way of $O_2$, for example, at the flow rates above. In some embodiments, the ratio of hydrogen (e.g., $H_2$) and oxygen (e.g., $O_2$) summation to the carrier gas ($N_2$) provided to the substrate 204 in the RTH process is between approximately 13:7 to approximately 16:1 by volume.

It is noted that the hydrogen and oxygen are provided at different flowrates and indeed may be provided at different inlets to the chamber providing the RTH process. Said differently, in some embodiments, the hydrogen and oxygen sources are distinct from one another; the hydrogen and oxygen are not bonded to one another.

It is noted that the amount of hydrogen available to the substrate 204 must be controlled. Too much hydrogen in the atmosphere may result in over-reaction with the fin 206, which may cause fin damage such a fin collapsing. In an embodiment, the hydrogen source may be provided as a compound, not as pure $H_2$. The advantages of this are the ability to maintain a high temperature for the RTH process without the risk of flammability of pure $H_2$. Exemplary compounds that provide the hydrogen include HCl. Thus, in an embodiment, the RTH process provides HCl, $O_2$, and $N_2$. In an embodiment, the RTH process consists of only the gases HCl, $O_2$ and $N_2$.

In an embodiment, the RTH process is conducted for between approximately 1 to 2 minutes. In an embodiment, the IL 406 using the RTH process to a thickness of between approximately 8 Angstroms and approximately 12 Angstroms.

After formation of the interface layer such as the RTH process, the method 100 then proceeds to block 112 where a clean process is performed. In an embodiment, the clean process serves to condition the surface of the IL layer formed in block 110 to prepare the surface for subsequent deposition of the gate dielectric layer. In an embodiment, the clean process conditions the surface by bonding —OH functional groups to the surface. In some embodiments, the clean of block 112 is omitted.

In an embodiment, the clean process includes a multi-stage clean. The multi-stage clean may include ozone+standard clean 1 (SC1)+standard clean 2 (SC2). The standard clean 1 (SC1) includes providing a cleaning solution including ammonia, hydrogen peroxide, and deionized water (DI water). The standard clean 2 (SC2) includes a cleaning solution of hydrochloric acid (HCl), hydrogen peroxide (H2O2), and deionized water (DI water). The ozone cleaning stage may also include DI water in addition to the ozone.

Figure 5:
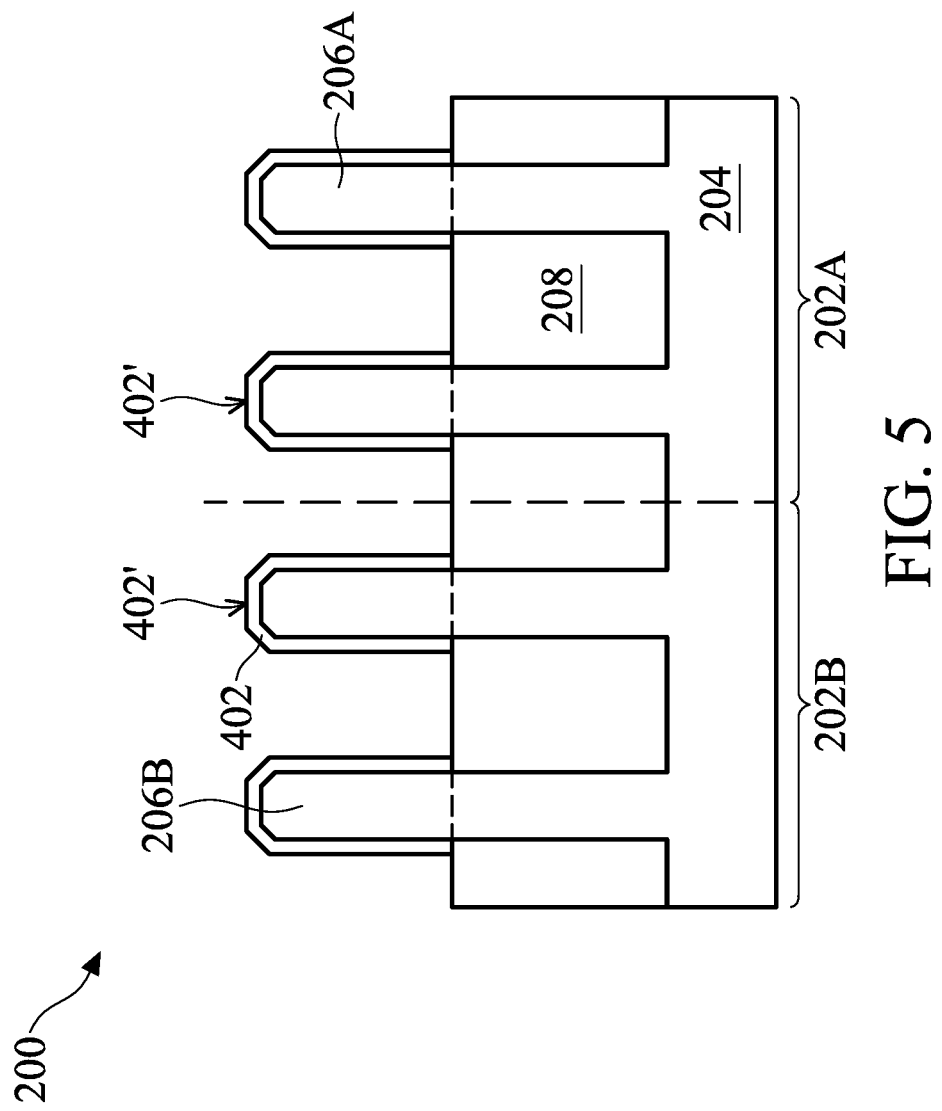
Figure 6:
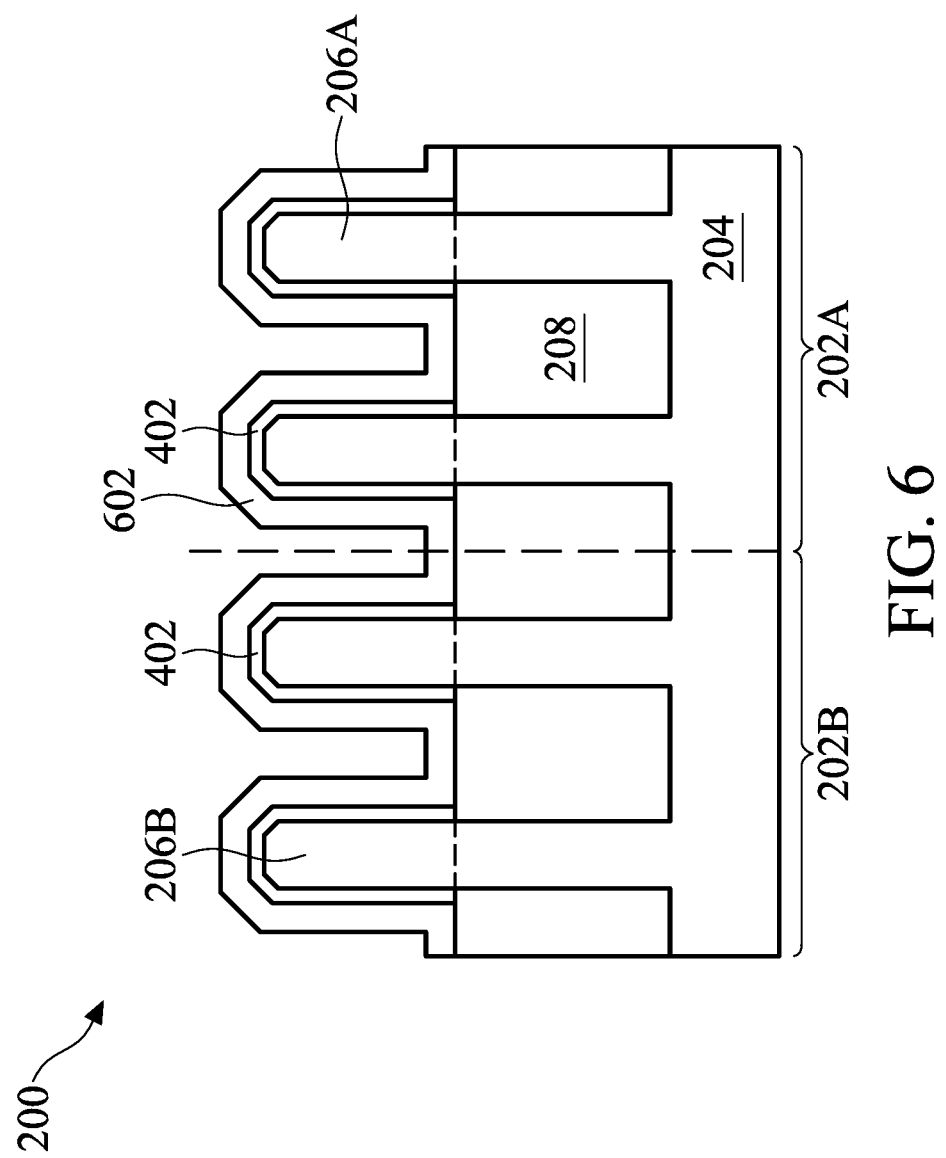

Referring to the example of FIG. 5, the surface of the IL layer 402 has been treated by the clean process to form surface 402' of the IL layer 402. In an embodiment, the surface 402' includes —OH functional groups exposed.

The method 100 then proceeds to block 114 where a gate dielectric layer is formed over the interface layer formed in block 110. In an embodiment, the gate dielectric layer is a high-k dielectric material. Referring to the example of FIG. 6, a gate dielectric layer 602 is formed over the IL 402. In an embodiment, the gate dielectric layer 602 is formed directly on the treated surface 402' of the IL layer 402.

Gate dielectric layer 602 include a dielectric material, such as silicon oxide, high-k dielectric material, other suitable dielectric material, or combinations thereof. In the depicted embodiment, gate dielectric layer 602 include one or more high-k dielectric layers including, for example, hafnium, aluminum, zirconium, lanthanum, tantalum, titanium, yttrium, oxygen, nitrogen, other suitable constituent, or combinations thereof. In some implementations, the one or more high-k dielectric layers include $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. High-k dielectric material generally refers to dielectric materials having a high dielectric constant, for example, greater than that of silicon oxide (k≈3.9). Gate dielectric layers may be formed by various processes, such as ALD, CVD, PVD, and/or other suitable process. The gate dielectric layer 602 may be same composition in the NMOS region 202A as the PMOS region 202B—or may differ in composition. The gate dielectric layer 602 may include a plurality of layers with varying dielectric compositions.

The equivalent oxide thickness (EOT) of the device 200 may be determined by the summation of the gate dielectric layer 602 and the interface layer 402.

The method 100 then proceeds to block 116 where a gate electrode layer(s) is formed over the gate dielectric layer of block 114. In an embodiment, a gate electrode is formed directly on the gate dielectric layer. In an embodiment, the gate electrode includes an electrically conductive material that provides an appropriate work function for the resulting device. In some embodiments, additional layers (e.g., capping layers) may be formed between work function layers of the gate electrode and the gate dielectric layer.

Figure 7:
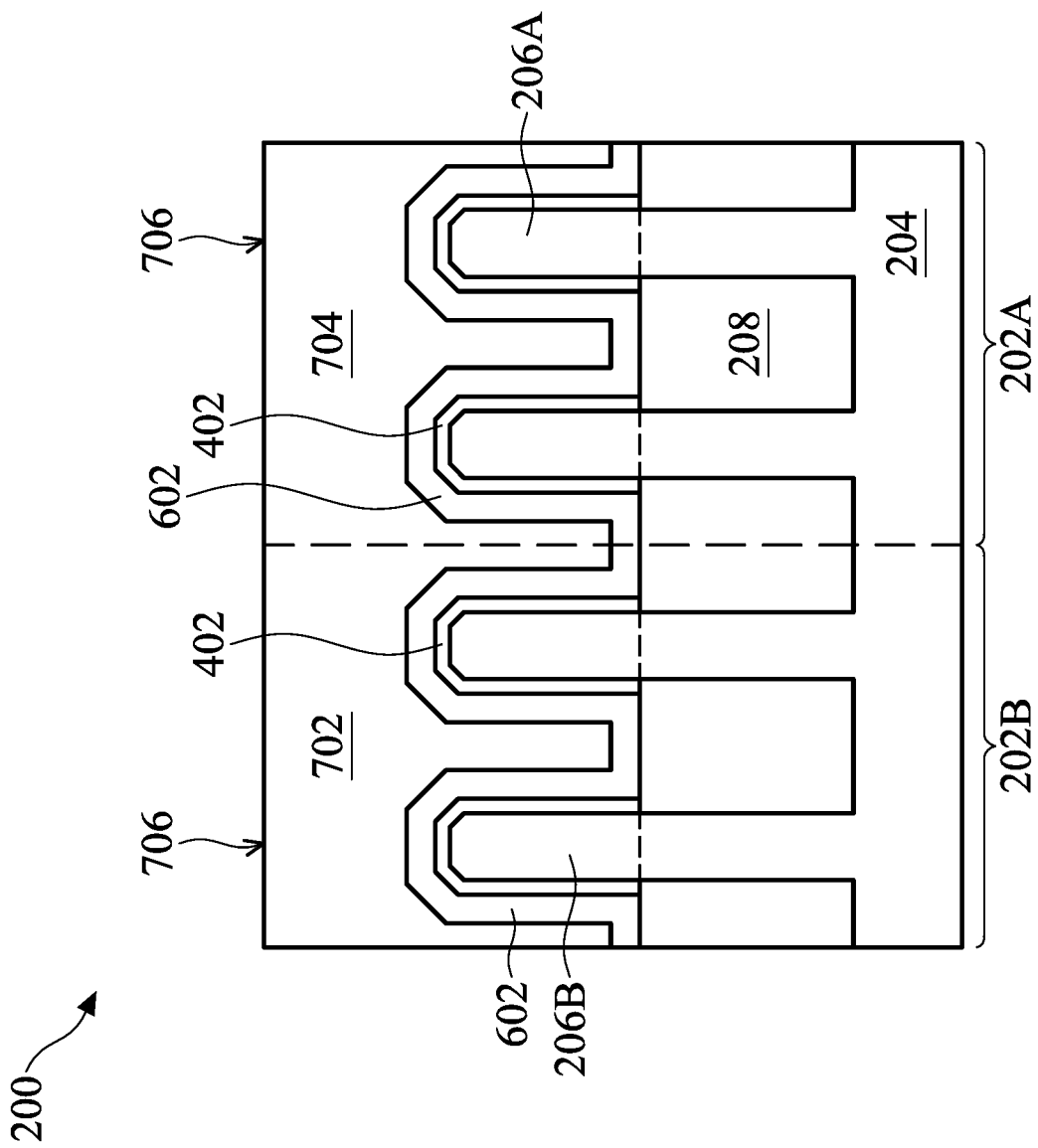

Referring to the example of FIG. 7, gate electrode layers 704 and 702 are formed in the NMOS region 202A and the PMOS region 202B of the substrate 204 respectively. In an embodiment, the gate electrode layers 702 provide a p-type work function. In an embodiment, the gate electrode layers 704 provide an n-type work function.

In some implementations, gate electrodes 702 and 704 each include multiple layers, such as one or more capping layers, work function layers, glue/barrier layers, and/or metal fill (or bulk) layers. A capping layer can include a material that prevents or eliminates diffusion and/or reaction of constituents between gate dielectric layer(s) 602 and other layers of gate structure (in particular, gate layers including metal). In some implementation, the capping layer includes a metal and nitrogen, such as titanium nitride (TiN), tantalum nitride (TaN), tungsten nitride (W2N), titanium silicon nitride (TiSiN), tantalum silicon nitride (TaSiN), or combinations thereof. A work function layer can include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu. In some implementations, a hard mask layer (including, for example, silicon nitride or silicon carbide) is disposed over at least a portion of gate electrodes 702, 704. Gate electrodes 702, 704 are formed by various deposition processes, such as ALD, CVD, PVD, and/or other suitable process. It is noted that FIG. 7 is illustrative only and not intended to imply the device 200 must include an interface between the gate electrodes 702, 704 but, as discussed above, various features may interpose regions 202B and 202A.

The gate electrodes 702 or 704, in conjunction with the gate dielectric layer 602 and the IL 402, provide for a respective gate stack 706. The gate stack 706 forms a gate structure of the device 200 controlling the channel region of the fin elements 206 over which it is formed.

Figure 8:
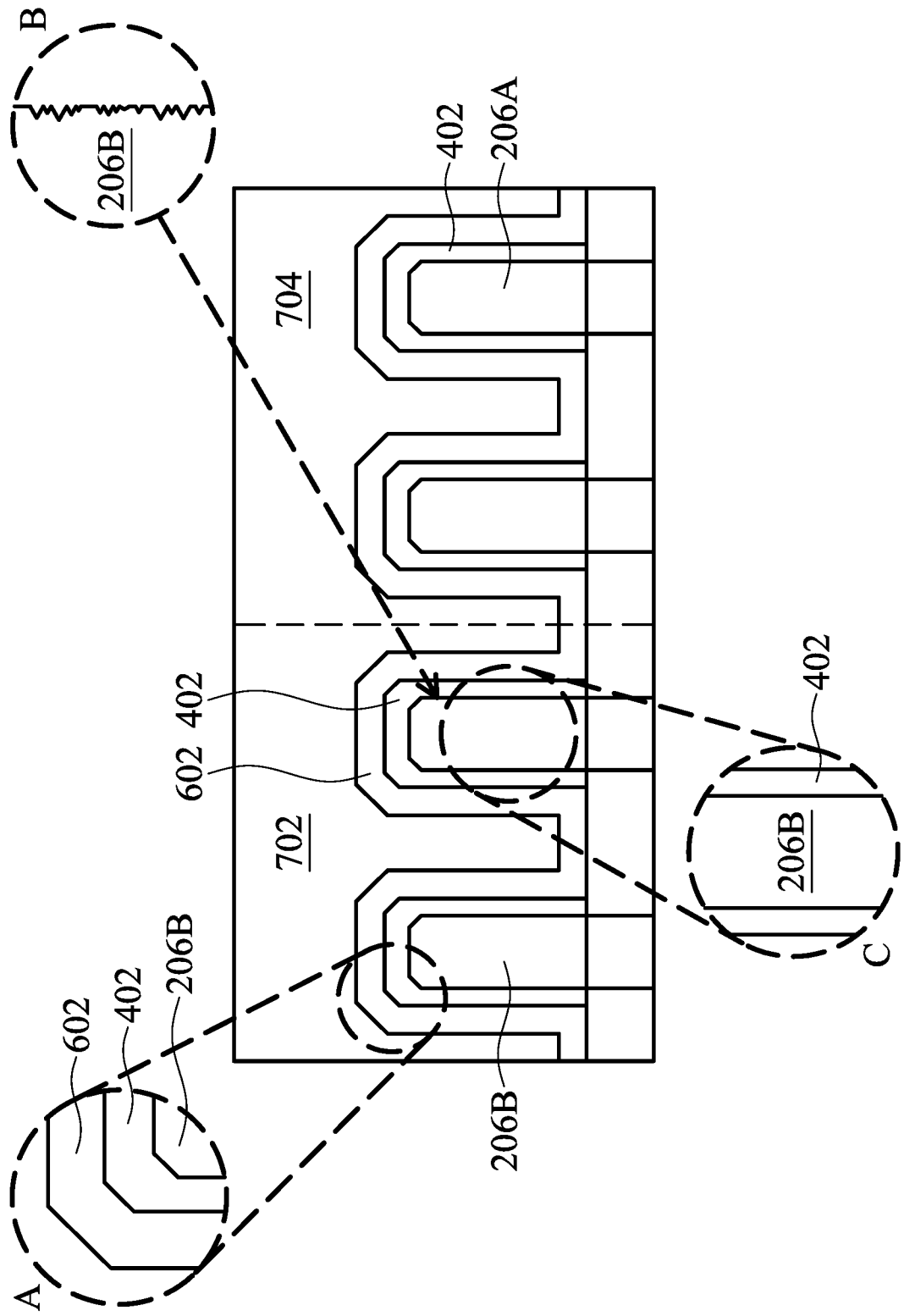

FIG. 8 is illustrative of a focused view of the IL 402 with respect to the fin elements 206. FIG. 8 is illustrative of the rounding of the corners of the fin element 206 (see inset A). In an embodiment, the fin 206 have a corner rounding shape as illustrated in insert A due to the reflowing of the semiconductor composition of the fin 206 during the RTH process used to form the IL 402. The rounded-corner shape may be present on fin 206A and/or 206B. The rounded-corner shape may be defined by the fin 206 having an outer surface that is curvilinear at the interface between a sidewall of the fin 206 and a top surface of the fin 206.

FIG. 8 is also illustrative of a relative surface roughness of the surfaces of the fin element 206 having the IL 402 formed thereon. See inset B. In an embodiment, the fins 206 have a surface roughness that is decreased due to the IL 402 formation by the RTH process. In an embodiment, it has been determined that the surface roughness of fin upon which a dielectric layer is formed by chemical oxidation has a roughness measured of approximately 0.172 root-mean-square (Rms) (nm); the surface roughness of a similar fin upon which an interface layer such as IL 402 is formed by an RTH process has a roughness of approximately 0.164 Rms (nm). In some embodiments, the improvement (decrease) in surface roughness may be approximately 5% as measured by Rms. In an embodiment, the surface roughness improvement may be provided on fins such as fins 206A and fins such as fins 206B. In an embodiment, a fin element 206 having the IL 402 formed thereon where the IL 402 is formed by RTH has a width that varies less (e.g., from top to bottom) than a similar fin upon which an interface layer formed by chemical oxidation is formed. In a further embodiment, the fluctuation of the fin width after growing a chemical oxide thereon can be between approximately 7.5 and approximately 8.5 nanometers, or approximately 11-15% variation in width along the height of the fin. In contrast, in an embodiment, the fluctuation of the fin width after forming an oxide such as IL 402 by an RTH process can be between approximately 8 and approximately 8.5 nanometers, or approximately 4% to less than 10% variation in width along the height of the fin.

In an embodiment, the RTH process is used to form the interface layer 402 on the fin 206B that is comprised of silicon germanium fin. The RTH process can also affect the percentage of germanium provided in the IL 402 and the fin 206B. In an embodiment, it has been determined that the germanium percentage of a channel region upon which a dielectric layer is subsequently to be formed is approximately 29% to approximately 35%. After growth by chemical oxidation of a chemical oxide interfacial layer, the chemical oxide has a germanium concentration of approximately 4 to approximately 6% The germanium concentration of a similar channel region, such as illustrated by fin 206B, upon which an interface layer, such as IL 402, of a similar thickness to that of the dielectric layer is formed by an RTH process has a germanium concentration of approximately 25% and 28%. Thus, in some embodiments, the fin prior to formation of an IL has a germanium concentration between approximately 29% and approximately 35%. After growing the IL such as IL 402 by RTH process, the germanium concentration is between approximately 25% and 28%. Thus, in some embodiments, the germanium concentration may be reduced by 10%. In some embodiments, the germanium concentration may be decreased by approximately 3.5% by implementing the IL 402 using a RTH process. The percentages discussed above may be with respect to an atomic percentage ratio calculated with respect to the sum of Si—Si and Si—Ge bonding. In an embodiment, it has been determined that the germanium percentage of a dielectric layer formed by chemical oxidation of a SiGe fin is a SiGeOx with a GeOx % of approximately 4-6% In contrast, formation of an interface layer such as IL 402 of a similar thickness to that of the dielectric layer on a SiGe fin, such as fin 206B, formed by an RTH process is a SiGeOx with a GeOx % of approximately 1 and approximately 3% germanium. In some embodiments, the germanium oxide concentration may be decreased by approximately 10% by use of RTH process to form a dielectric layer over a channel region. The percentages discussed above may be with respect to an atomic percentage ratio of the feature calculated as the percentage of the sum of Si—O and Ge—O bonding.

Returning to FIG. 1 and the embodiment of the method 100, in some embodiments, the method 100 continues to additional fabrication steps of the device such as the FinFET device 200. For example, fabrication can continue with forming a multilayer interconnect features including contacts to the gate stack discussed above.

Figure 9:
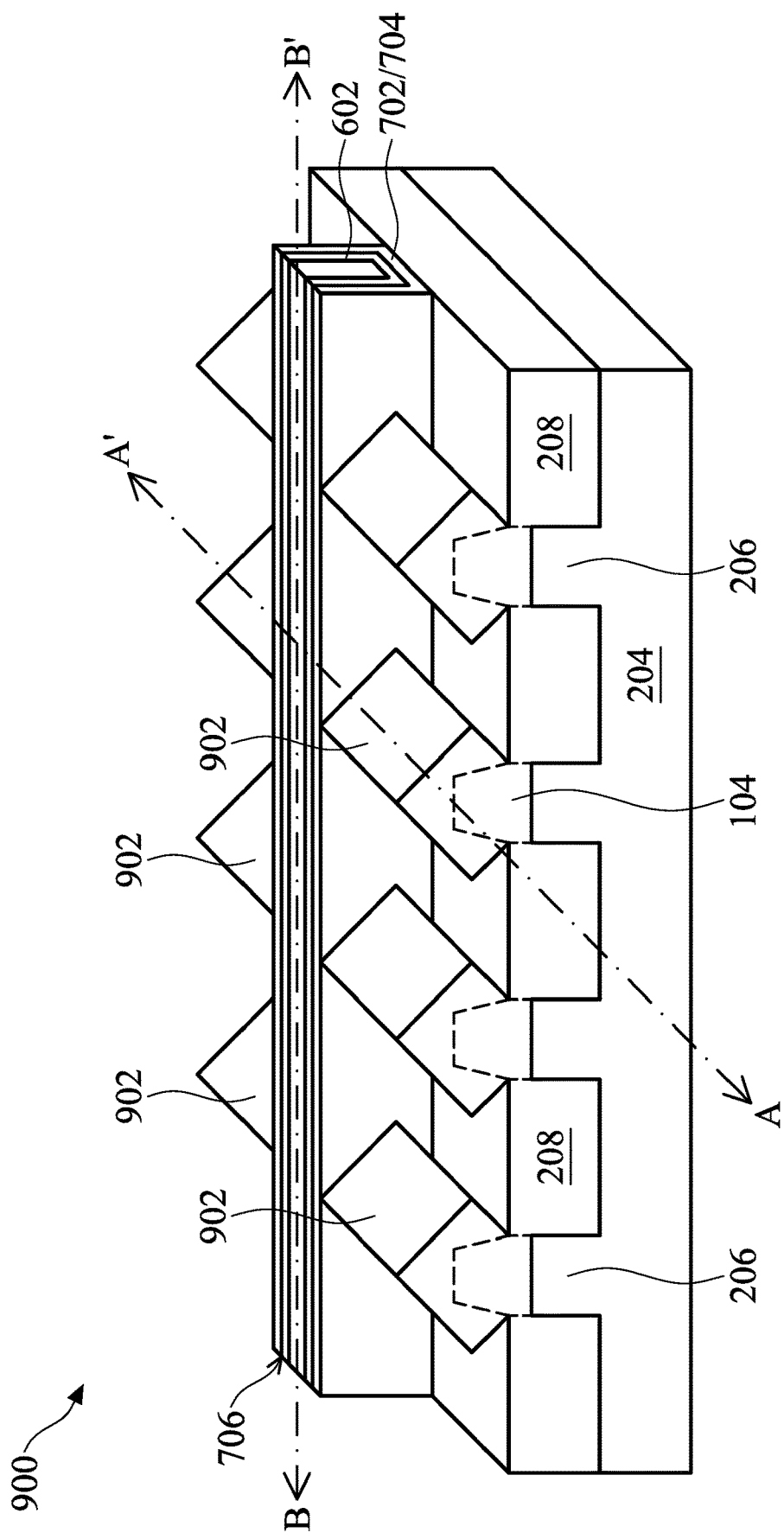
FIG. 9 is a fragmentary perspective view of a FinFET device, in portion or entirely, according to various aspects of the present disclosure.

FIG. 9 is illustrative of a semiconductor device, FinFET device 900, that may also be formed using the method 100. The FinFET device 900 may be substantially similar to the FinFET device 200 discussed above with reference to exemplary FIGS. 2-8. In an embodiment, the FinFET 900 is illustrative of a portion of the FinFET device 200 (e.g., of a single gate structure).

FinFET device 900 includes source/drain features 902 adjacent the gate structure. In some embodiments, the source/drain features 902 are epitaxial features formed on, over, or in fins 206. In some implementations, epitaxial source/drain features 902 are formed after forming the dummy gate, discussed above in block 104, and before replacing the dummy gate with the metal gate discussed above in blocks 110-116. For example, semiconductor material is epitaxially grown on fins 206 to form epitaxial source/drain features 902. In some implementations, the fins 206 are recessed (for example, an etch back process) before forming the source/drain features 902 thereon. The source/drain features 902 may be formed by suitable processes such as epitaxy processes including CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. Epitaxial source/drain features 902 are doped with n-type dopants and/or p-type dopants. The source/drain features 902 are configured with respect to the device type, for example, varying in dopant type for n-type devices and p-type devices. In some implementations, epitaxial source/drain features 902 are doped during deposition by adding impurities to a source material of the epitaxy process. In some implementations, epitaxial source/drain features 902 are doped by an ion implantation process after a deposition process. In some embodiments, the source/drain features 902 may be merged or partially merged with one another.

Figure 10:
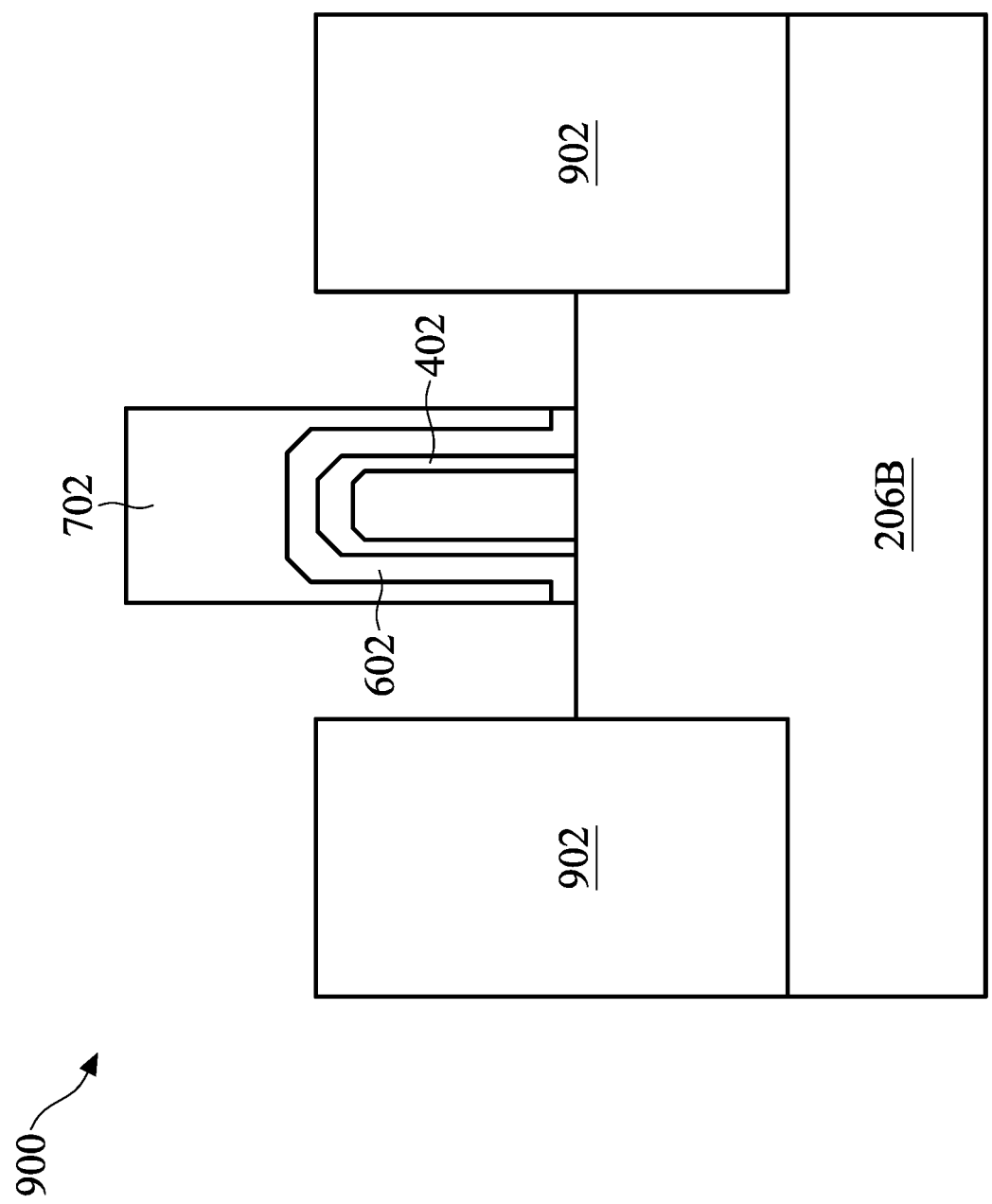
FIG. 10 is a fragmentary cross-sectional view of a FinFET device, in potion, according to various aspects of the present disclosure.

The cross-sectional views of the FinFET device 200 of FIGS. 2-8 are provided along the B-B' axis illustrated in FIG. 9. FIG. 10 is illustrative of a cross-sectional view along the A-A' axis illustrated in FIG. 9 from the perspective of a gate stack 706 formed on the PMOS region 202B.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

For example, implementations of the methods and devices discussed herein may in some embodiments improve mobility of a resultant device. The improved mobility may be generated from the reduction of Ge build up at a channel region and/or the smoothing of a channel region surface provided by the processes used to form an interface layer over the channel region. In some embodiments, mobility of the device may be improved by approximately 3 to approximately 5 percent over a device being fabricated using a chemical oxide interfacial layer.

In one of the broader embodiments provided herein, a method is provided including providing a substrate having a channel region and growing an oxide layer on the channel region. Growing the oxide layer includes a plurality of steps such as, introducing a first source gas providing oxygen and introducing a second source gas providing hydrogen, the second source gas being different than the first source gas. The growing the oxide layer includes bonding the oxygen to a semiconductor element of the channel region to form the oxide layer and bonding the hydrogen to the semiconductor element of the channel region to form a semiconductor hydride byproduct. A gate dielectric layer is then formed over the oxide layer. A gate electrode is formed over the gate dielectric layer.

In a further embodiment, the growing the oxide layer forms a silicon germanium oxide layer. In an embodiment, the channel region is formed on a fin element extending from the substrate. The fin element may be formed by epitaxially growing a silicon germanium region over a silicon substrate when the semiconductor element is germanium. In an embodiment, the second source gas is HCl. The growing the oxide layer may further include introducing a third gas of nitrogen. In an embodiment, the oxide layer is silicon germanium oxide and the semiconductor hydride byproduct includes hydrogen and germanium.

In another of the broader embodiments discussed herein, a method includes providing a substrate having a first fin and a second fin extending over the substrate. The first fin may be different in composition than the second fin. An oxide layer is formed over the first fin and the second fin. The oxide layer over the first fin comprises a first oxide composition and the oxide layer over the second fin comprises a second oxide composition. The oxide layer is grown by introducing an oxygen containing gas to the substrate at a first flow rate and introducing a hydrogen containing gas to the substrate at a second flow rate, different than the first flow rate.

In a further embodiment, the first flow rate is less than the second flow rate. In an embodiment, the introducing the oxygen containing gas and the introducing the hydrogen containing gas are concurrent. In an embodiment, the first oxide is silicon germanium oxide and the second oxide composition is silicon oxide.

In some embodiments, introducing the oxygen containing gas includes providing $O_2$. In a further embodiment, the source of oxygen to the chamber consists of the oxygen containing gas $O_2$. In an embodiment, the method includes forming a gate dielectric layer directly on the first oxide composition and the second oxide composition.

In an embodiment, the method includes bonding the oxygen from the oxygen containing gas to the first fin to form the first oxide composition while bonding the hydrogen from the hydrogen containing gas to a semiconductor element of the first fin. Further embodiments include after bonding the hydrogen from the hydrogen containing gas to the semiconductor element of the first fin, removing the bonded hydrogen and semiconductor element from a process chamber. The semiconductor element may be germanium, and germanium hydride can be removed from the process chamber.

In another of the broader embodiments, an integrated circuit device is provided that includes a first fin structure and a second fin structure extending from a substrate. The first fin structure is a first composition, and includes rounded corners. The second fin structure is a second composition, different than the first composition. A first interface layer is formed directly on the first fin structure including the rounded corners and a second interface layer directly on the second fin structure. The first interface layer is an oxide of the first composition and the second interface layer is an oxide of the second composition. A gate dielectric layer is formed over the first interface layer and the second interface layer. The rounded corners may be comprised of silicon germanium.

In a further embodiment of the integrated circuit device, the second fin structure also includes rounded corners. In an embodiment, the device further includes a first metal gate electrode formed over the gate dielectric layer over the first fin structure and a second metal gate electrode formed over the gate dielectric layer over the second fin structure.

What is claimed is:

1. A method comprising:
providing a substrate having a channel region;
growing an oxide layer on the channel region, wherein the growing the oxide layer includes:
introducing a first source gas providing oxygen;
introducing a second source gas providing hydrogen, the second source gas being different than the first source gas;
bonding the oxygen to a semiconductor element of the channel region to form the oxide layer; and
bonding the hydrogen to the semiconductor element of the channel region to form a semiconductor hydride byproduct;
forming a gate dielectric layer over the oxide layer; and
forming a gate electrode over the gate dielectric layer.

2. The method of claim 1, wherein the growing the oxide layer forms a silicon germanium oxide layer.

3. The method of claim 1, wherein providing the substrate having the channel region includes forming the channel region on a fin element extending from the substrate.

4. The method of claim 3, wherein the fin element is formed by epitaxially growing a silicon germanium region over a silicon substrate, and wherein the semiconductor element is germanium.

5. The method of claim 1, wherein the second source gas is HCl.

6. The method of claim 1, wherein the growing the oxide layer further includes introducing a third gas of nitrogen.

7. The method of claim 1, wherein the oxide layer is silicon germanium oxide and the semiconductor hydride byproduct includes hydrogen and germanium.

8. A method comprising:
providing a substrate having a first fin and a second fin extending over the substrate wherein the first fin is different in composition than the second fin;
growing an oxide layer over the first fin and the second fin, wherein the oxide layer over the first fin comprises a first oxide composition and the oxide layer over the second fin comprises a second oxide composition, the growing the oxide layer including:
introducing an oxygen containing gas to the substrate at a first flow rate; and
introducing a hydrogen containing gas to the substrate at a second flow rate, different than the first flow rate; and
forming a gate dielectric layer directly on the first oxide composition and the second oxide composition.

9. The method of claim 8, wherein the first flow rate is less than the second flow rate.

10. The method of claim 8, wherein the introducing the oxygen containing gas and the introducing the hydrogen containing gas are concurrent.

11. The method of claim 8, wherein the first oxide composition is silicon germanium oxide and the second oxide composition is silicon oxide.

12. The method of claim 8, wherein the introducing the oxygen containing gas includes providing 02.

13. The method of claim 8, wherein the gate dielectric layer is a high-k dielectric material.

14. The method of claim 8, further comprising:
bonding the oxygen from the oxygen containing gas to the first fin to form the first oxide composition while bonding the hydrogen from the hydrogen containing gas to a semiconductor element of the first fin.

15. The method of claim 14, further comprising:
after bonding the hydrogen from the hydrogen containing gas to the semiconductor element of the first fin, removing the bonded hydrogen and semiconductor element from a process chamber.

16. The method of claim 15, wherein the semiconductor element is germanium, and germanium hydride is removed from the process chamber.

17. A method comprising:
providing a substrate having a silicon fin and a silicon germanium fin extending over the substrate;
removing a dummy gate structure to expose a region of the silicon fin and the silicon germanium fin;
growing an oxide layer in the region over the silicon fin and the silicon germanium fin, wherein a silicon oxide layer is grown on the silicon fin and a silicon germanium oxide layer is grown on the silicon germanium fin, the growing the oxide layer including:
introducing an oxygen containing gas to the substrate at a first flow rate; and
introducing a hydrogen containing gas to the substrate at a second flow rate, different than the first flow rate.

18. The method of claim 17, further comprising:
forming a gate dielectric layer over the oxide layer on the silicon fin and the silicon germanium fin.

19. The method of claim 17, wherein the providing the substrate having the silicon germanium fin includes providing a germanium percentage of between approximately 29% and 35%.

20. The method of claim 19, wherein the silicon germanium oxide layer has a germanium percentage of between 4 and 6 percent and the silicon germanium fin has a decreased germanium percentage after the growing the oxide layer.

* * * * *